United States Patent
Jeong et al.

(10) Patent No.: US 8,648,408 B2
(45) Date of Patent: Feb. 11, 2014

(54) SEMICONDUCTOR DEVICE

(71) Applicant: Samsung Electronics Co., Ltd., Suwon-si (KR)

(72) Inventors: Yong-Kuk Jeong, Suwon-si (KR); Sang-Wook Park, Yongin-si (KR); Min-Hee Choi, Goyang-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 13/753,588

(22) Filed: Jan. 30, 2013

(65) Prior Publication Data
US 2013/0207195 A1    Aug. 15, 2013

(30) Foreign Application Priority Data
Feb. 10, 2012    (KR) .................. 10-2012-0013807

(51) Int. Cl.
*H01L 21/02*    (2006.01)
(52) U.S. Cl.
USPC .... 257/324; 257/317; 257/325; 257/E21.267; 257/E27.103; 257/E29.309

(58) Field of Classification Search
USPC .................. 257/317–325, E21.267, 679–689, 257/27.103, 29.303–309
See application file for complete search history.

(56) References Cited

U.S. PATENT DOCUMENTS

| | | | | |
|---|---|---|---|---|
| 4,688,078 | A * | 8/1987 | Hseih | 257/321 |
| 5,731,238 | A * | 3/1998 | Cavins et al. | 438/261 |
| 5,763,937 | A * | 6/1998 | Jain et al. | 257/646 |
| 7,488,690 | B2 | 2/2009 | Iyer et al. | |
| 7,531,411 | B2 * | 5/2009 | Lu et al. | 438/264 |
| 7,615,432 | B2 | 11/2009 | Kim et al. | |
| 7,977,183 | B2 | 7/2011 | Koide | |
| 8,263,458 | B2 * | 9/2012 | Chen et al. | 438/257 |
| 2011/0075486 | A1 * | 3/2011 | Liao et al. | 365/185.18 |

* cited by examiner

*Primary Examiner* — Michael Lebentritt
(74) *Attorney, Agent, or Firm* — Volentine & Whitt, PLLC

(57) ABSTRACT

A semiconductor device includes a substrate, a gate structure disposed on the substrate and which includes a gate insulating layer and a gate electrode layer, a first nitride layer disposed on the substrate and the gate structure and which includes silicon, and a second nitride layer that is disposed on the first nitride layer and has an atomic percentage of silicon less than that of the first nitride layer.

20 Claims, 7 Drawing Sheets

1000

SEMICONDUCTOR DEVICE

PRIORITY STATEMENT

This application claims the benefit of Korean Patent Application No. 10-2012-0013807, filed on Feb. 10, 2012, in the Korean Intellectual Property Office, the disclosure of which is hereby incorporated by reference in its entirety.

BACKGROUND

The inventive concept relates to semiconductor devices. More particularly, the inventive concept relates to the region of semiconductor devices that includes gate structures.

Semiconductor devices used in today's electronics, such as computers or mobile phones and the like, provide a large amount of data storage capacity and offer high performance. There are increasing demands, though, for electronics that are more compact and/or that offer greater numbers of functions. In an attempt to meet these demands, the design rules of semiconductor devices are being reduced in a way that will increase the integration density of the semiconductor devices. Especially for semiconductor devices that must provide a large number of transistors, the gate length, which is a standard parameter of a transistor set by the design rules, and the distances between adjacent ones of the gates are being reduced.

SUMMARY

According to an aspect of the inventive concept, there is provided a semiconductor device which includes a substrate, a gate structure disposed on the substrate and including a gate insulating layer and a gate electrode layer, a first nitride layer that is disposed on the substrate and the gate structure and that includes silicon, and a second nitride layer that is disposed on the first nitride layer and has a lower atomic percentage of silicon than the first nitride layer.

According to another aspect of the inventive concept, there is provided a semiconductor device which includes a substrate having a plurality of active regions that are spaced apart from one another in a first direction, a plurality of gates spaced apart from one another on the substrate in a second direction different from the first direction and each of which crosses the plurality of active regions, a first nitride layer disposed on the gates and extending over an upper surface of the substrate to the side of the gates, a second nitride layer that is disposed on the first nitride layer and has an atomic percentage of silicon different from that of the first nitride layer, and a plurality of contact plugs that are interposed between the gates in the first direction, and extend through the first nitride layer and the second nitride layer over the active regions.

According to still another aspect of the inventive concept, there is provided a semiconductor substrate having an active region, a plurality of gates spaced apart from one another in a first direction and each of which extends across the active region in a second direction different from the first direction, a first nitride layer that includes silicon and covers opposing sidewall surfaces of each pair of the gates adjacent one another in the first direction, a second nitride layer that includes silicon, covers the first nitride layer on the opposing sidewall surfaces of the gates, and has an atomic percentage of silicon different from that of the first nitride layer, an interlayer insulating layer disposed on the substrate and occupying a region of the device between the gates, and at least one respective contact plug extending through the interlayer insulating layer at a location between the gates in the first direction.

BRIEF DESCRIPTION OF THE DRAWINGS

The inventive concept will be more clearly understood from the following detailed description of the preferred embodiments thereof taken in conjunction with the accompanying drawings in which.

DETAILED DESCRIPTION OF THE PREFERRED EMBODIMENTS

Figure 1A:
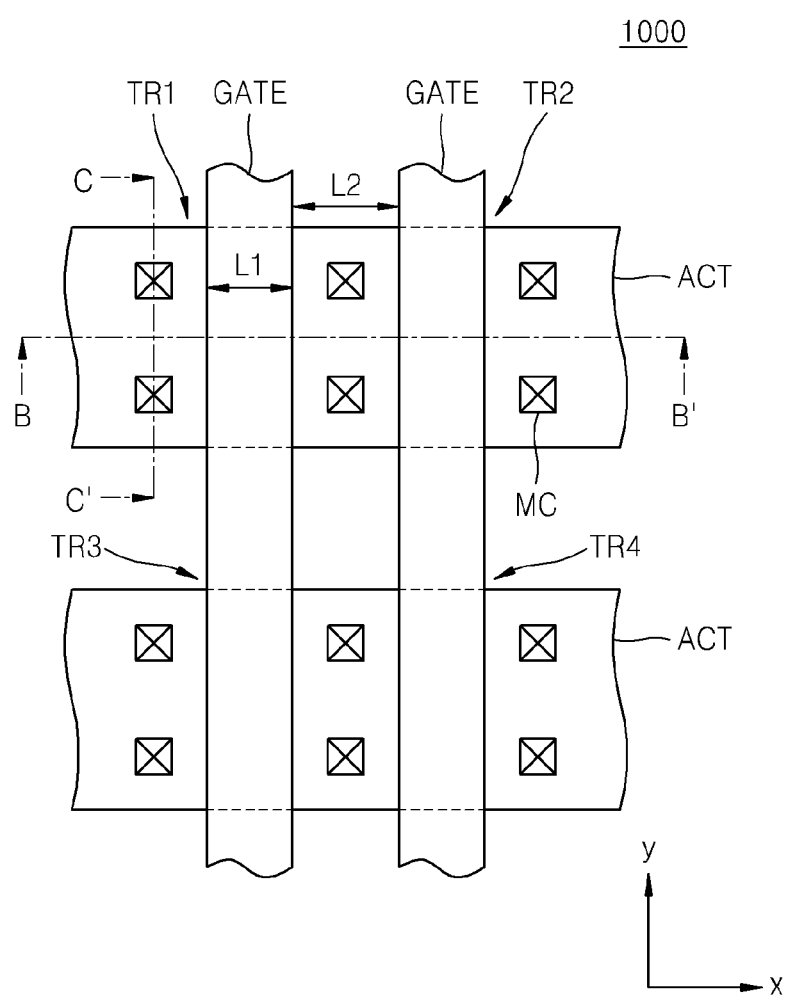
FIG. 1A illustrates a layout of an embodiment of a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. In this respect, too, even if not specifically described, the drawings show whether and element or layer is disposed directly on another element or layer, or whether one element is directly connected to another, in examples of the inventive concept.

Other terminology used herein for the purpose of describing particular examples or embodiments of the inventive concept is to be taken in context. For example, the terms "comprises" or "comprising", and "has" or "having", etc., when used in this specification specifies the presence of stated features or processes but does not preclude the presence or additional features or processes. The term "connected" will generally refer to an electrical connection as will be clear in context.

Referring to FIG. 1A, an embodiment of a semiconductor device 1000 according to the inventive concept includes a plurality of active regions ACT that extend in one of a first and second direction, for example, an x-direction, and a plurality of gates GATE that cross the plurality of active regions ACT and extend in the other of the first and second directions, for example, a y-direction. The semiconductor device 1000 also has a plurality of transistors TR1, TR2, TR3, and TR4.

Channel regions of the transistors TR1, TR2, TR3, TR4, which include the gates GATE, are provided in portions of the active regions ACT that are crossed by the gates GATE. Also, contact plugs MC are disposed on the active regions ACT. The contact plugs MC are disposed on opposite sides of the gates GATE along the x-direction. Portions of the active regions ACT that are divided by the gates GATE are source regions and drain regions of the transistors TR1, TR2, TR3, and TR4. In this case, the transistors TR1, TR2, TR3, and TR4 that are adjacent to one another in the x-direction share one of the source and drain regions.

As a semiconductor device of the type described above becomes more highly integrated, a first length L1, which is a length of each of the gates GATE, and a second length L2, which is a distance between the adjacent gates GATE, may become smaller.

A more detailed description of the semiconductor device 1000 will now be made with reference to FIG. 1B.

The semiconductor device 1000 includes a substrate 100 in which a device isolation layer 102 is formed, a gate structure 110 on the substrate 100, a first nitride layer 120 covering the gate structure 110 and the substrate 100, and a second nitride layer 130 on the first nitride layer 120. The gate structure 110 may include a gate insulating layer 112, a gate electrode layer 114, and a spacer 116.

In addition, the semiconductor device 1000 may include a source region and a drain region (hereinafter, "a source/drain region 105") formed of portions of the substrate 100 at opposite sides of each gate GATE constituted by the gate structure 110, and a contact plug layer 170 connected to the source/drain region 105. As the layout of FIG. 1A shows, however, the substrate of the semiconductor device may have a plurality of source regions to one side of each gate GATE and spaced apart in the second direction (along the y-axis), and a plurality of drain regions to the other side of each gate GATE and spaced apart in the second direction.

The semiconductor device 1000 having the above-described elements may be a circuit unit of a logic device or a memory device.

The active regions ACT shown in FIG. 1A correspond to a portion of the substrate 100 where the device isolation layer 102 is not present, and the gates GATE correspond to the gate electrode layer 114, and the contact plugs MC correspond to the contact plug layer 170. A plurality of contact plugs MC are connected to each of the plurality of source regions and to each of the plurality of drain regions.

The substrate 100 may comprise semiconducting material such as a Group IV semiconductor, a Group III-V semiconductor compound, or a Group II-VI semiconductor oxide. For example, the Group IV semiconductor may be silicon, germanium, or silicon-germanium. The substrate 100 may be a bulk wafer or may comprise an epitaxial layer. Also, the substrate 100 may have well regions (not shown) where the substrate is doped with impurities.

The device isolation layer 102 may be a shallow trench isolation (STI) structure. The device isolation layer 102 may be formed of an oxide, a nitride, or a combination of these. For example, the device isolation layer 102 may include at least one oxide selected from the group consisting of Tonen Silazene (TOSZ), a high temperature oxide (HTO), a High Density Plasma (HDP) material, a tetraethyl orthosilicate (TEOS), a borophosphosilicate glass (BPSG), and an undoped silicate glass (USG).

The source/drain region 105 in this embodiment are regions of the substrate 100 located on opposite sides of the gates GATE constituted by the gate structure 110. The source/drain region 105 is located in the active regions, extends to a predetermined depth in the active regions, and are regions of the substrate 100 doped with impurities. The impurities may be an n-type impurity such as phosphorous (P), arsenic (As), or antimony (Sb). Alternatively, the impurities may be a p-type impurity such as boron (B), aluminum (Al) or gallium (Ga).

The gate insulating layer 112 may include a high-k dielectric material. Alternatively, the gate electrode layer 114 may include a metal, a metal silicide, and/or polysilicon. The spacer 116 is disposed on sidewalls of the gate insulating layer 112 and the gate electrode layer 114. The spacer 116 may consist of a layer of a silicon nitride or silicon oxide, or may be formed of a plurality of layers each including a silicon nitride or silicon oxide. Although only two gates GATE are shown in FIG. 1B as constituted by the gate structure 110, the inventive concept is not so limited and the gate structure 110 may provide a greater number of gates GATE in a circuit unit of a semiconductor device according to the inventive concept.

The first nitride layer 120 and the second nitride layer 130 each may be a conformal layer so as to cover the gate structure 110 and the source/drain region 105. The first nitride layer 120 and the second nitride layer 130 may each be of at least one material selected from the group consisting of SiN, SiCN, SiON, and SiBN.

When the first nitride layer 120 is a silicon nitride layer, the first nitride layer 120 may be a silicon-rich nitride layer meaning that it is has a silicon content greater than that in a stoichiometric compound containing silicon and nitrogen. A stoichiometric compound refers to one in which the elements of the compound, in this case silicon and nitrogen, have a thermodynamically stable quantitative relationship. $Si_3N_4$ is a stoichiometric compound consisting of silicon and nitrogen. Accordingly, in a silicon-rich nitride expressed as $Si_xN$, x has a value greater than 0.75 wherein 'x' denotes the ratio of the number of silicon atoms to the number of nitrogen atoms. Thus, in an example of this embodiment, the first nitride layer 120 is a silicon-rich nitride layer $Si_xN$ wherein x has a value greater than 0.75. In one example of this embodiment, x has a value of 1.0 or greater.

The second nitride layer 130 may be a nitride layer containing silicon and whose atomic % of silicon is less than that of the first nitride layer 120. In addition, the second nitride layer 130 may be a nitride layer containing silicon and having an atomic ratio of silicon to nitrogen that is lower than that of the first nitride layer 120. For example, the second nitride layer 130 may be a silicon nitride layer expressed by $Si_xN$ wherein the value of x is less than less than 1.0, e.g., is 0.9. As another example, the second nitride layer 130 may be a nitrogen-rich silicon nitride layer. That is, the second nitride layer 130 may be a silicon nitride layer expressed by $Si_xN$ wherein the value of x is less than 0.75.

Furthermore, the first nitride layer 120 and the second nitride layer 130 may also be silicon nitride layers as described above, and which further include an impurity such as hydrogen (H).

The first nitride layer 120 has a thickness T1, and the second nitride layer 130 has a thickness T2. The thickness T1 may be greater than the thickness T2. For example, the first thickness T1 may be in a range of from about 150 Å to about 300 Å, and the second thickness T2 may be in a range of from about 10 Å to about 100 Å.

The first nitride layer 120 may apply stress to a channel region in the substrate 100 below the gate insulating layer 112. To this end, the first nitride layer 120 may be formed so as to have compressive stress or tensile stress, depending on the transistor type of the semiconductor device 1000, which induces the stress in the channel region. As a result, an energy band structure of the channel region is modified to increase the charge mobility in the channel. In general, it is known that tensile stress increases charge mobility, and compressive stress increases hole mobility. The second nitride layer 130 may also apply stress to the channel region in the substrate 100 below the gate insulating layer 112. In this case, as well, the second nitride layer 130 may have tensile stress or compressive stress, like the first nitride layer 120.

In one example, the stress induced in the channel region by the first nitride layer 120 (or nitride layers 120, 130) is at least 0.8 GPa.

The contact plug layer 170 is disposed on the source/drain region to apply a voltage to the source/drain region 105 to drive the transistors of the semiconductor device 1000. The contact plug layer 170 passes through an interlayer insulating layer 150 to be connected to the source/drain region 105, and an upper portion of the contact plug layer 170 may be connected to a wiring line (not shown). In an area not shown in FIG. 1B, the gate structure 110 may also be connected to a wiring line via an additional plug-type conductor (not shown). Also, as shown in FIGS. 1A and 1B, the contact plugs MC formed by the contact plug layer 170 pass through those portions of the first and second nitride layers 120 and 130 which extend over the upper surface of the substrate 100 to the side of the gates GATE.

A method of manufacturing a semiconductor device 1000 of the type shown in and described with reference to FIGS. 1A and 1B, according to the inventive concept, will now be described with reference to FIGS. 2A through 2E.

Figure 2A:
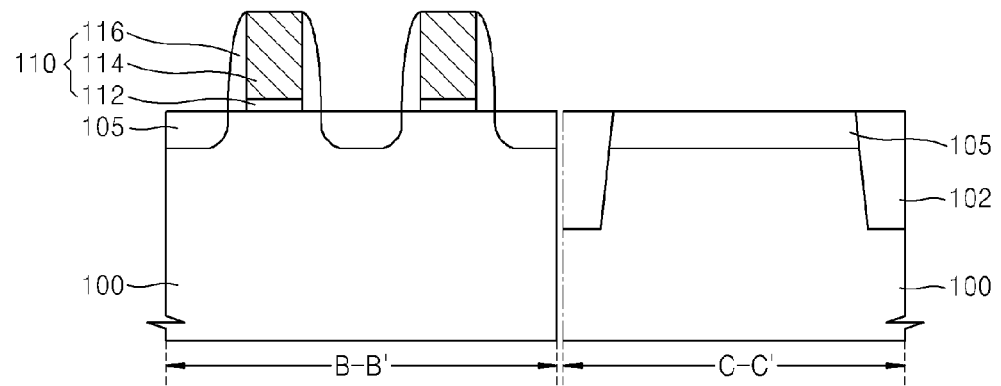
FIGS. 2A through 2E are cross-sectional views illustrating a method of manufacturing the semiconductor device of FIGS. 1A and 1B, according to the inventive concept.

Referring to FIG. 2A, first, the device isolation layer 102 is formed in the substrate 100. A well (not shown) may also be formed in the substrate 100. More specifically, impurities may be injected into an active region defined by the device isolation layer 102, i.e., selectively, to improve a threshold voltage of the semiconductor device 1000.

The device isolation layer 102 may be formed by etching the substrate 100 to form a trench, and depositing an insulating material in the trench. After depositing the insulating material, a planarization operation such as a chemical mechanical polishing (CMP) process may be performed to form the device isolation layer 102 as buried in the substrate 100.

Next, the gate structure 110 is formed on the substrate 100. First, a material for forming the gate insulating layer 112 and a material for forming the gate electrode layer 114 are sequentially deposited and patterned. Next, the spacer 116 is formed on sidewalls of the gate insulating layer 112 and the gate electrode layer 114.

The gate insulating layer 112 may be a layer of a high-k dielectric material, a silicon oxide, or a multi-layered structure of a silicon oxide layer and a silicon nitride layer. High-k dielectric material refers to a dielectric material having a dielectric constant greater than that of a silicon oxide. The high-k dielectric material may include at least one material selected from the group consisting of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode layer 114 may be a single layer or a multi-layered structure including at least one material selected from the group consisting of polysilicon, aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), and nitrides thereof. For example, the gate electrode layer 114 may be formed of a metal layer and va polysilicon layer.

The spacer 116 is of insulating material such as a silicon nitride. The spacer 116 may be formed by depositing an insulating material on the substrate 100 and the gate electrode layer 114, and performing an etch-back process such that an upper surface of the gate electrode layer 114 and an upper surface of the substrate 100 on two sides of the gate structure 110 are exposed.

Next, the source/drain region 105 is formed by injecting an impurity into the substrate 100 using the gate structure 110 as a mask. The impurity injection process may be performed by injecting ions into the substrate at a predetermined oblique angle relative to the upper surface or plane of the substrate 100.

Figure 2B:
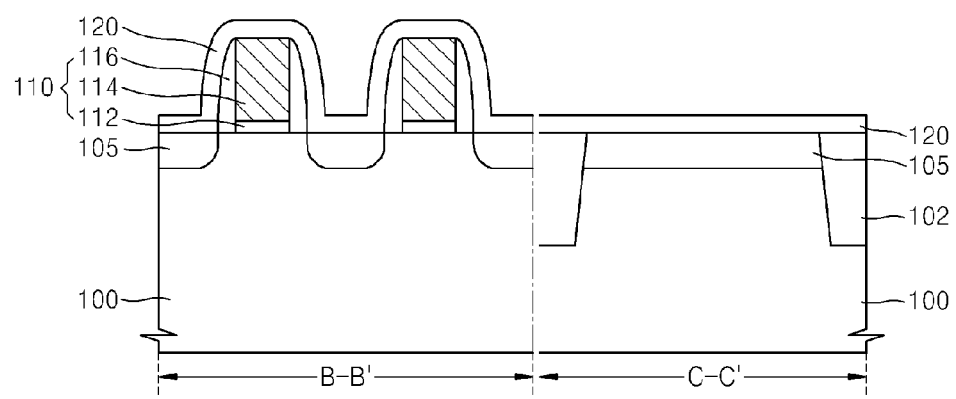

Referring to FIG. 2B, the first nitride layer 120 may be formed on the entirety of the exposed surfaces of the gate structure 110 and the source/drain region 105. The first nitride layer 120 may be formed using a CVD method such as a plasma-enhanced chemical vapor deposition (PECVD) or a low-pressure CVD (LPCVD) method. The first nitride layer 120 may be a silicon-rich nitride layer as described above. In this case, the first nitride layer 120 may be formed using, for example, $SiH_4$ gas and $NH_3$ gas as source gases for the silicon and nitrogen, respectively. The ratio of the $SiH_4$ gas to $NH_3$ gas is adjusted so that the resulting first nitride layer 120 is silicon rich.

Furthermore, the process conditions of forming the first nitride layer 120, e.g., ion bombardment, deposition gas, deposition pressure, and deposition temperature, may be set so that the first nitride layer 120 is stressed, for example, has tensile stress. The type and magnitude of the stress of the first nitride layer 120 can be designed for by selecting the appropriate process conditions.

Figure 2C:
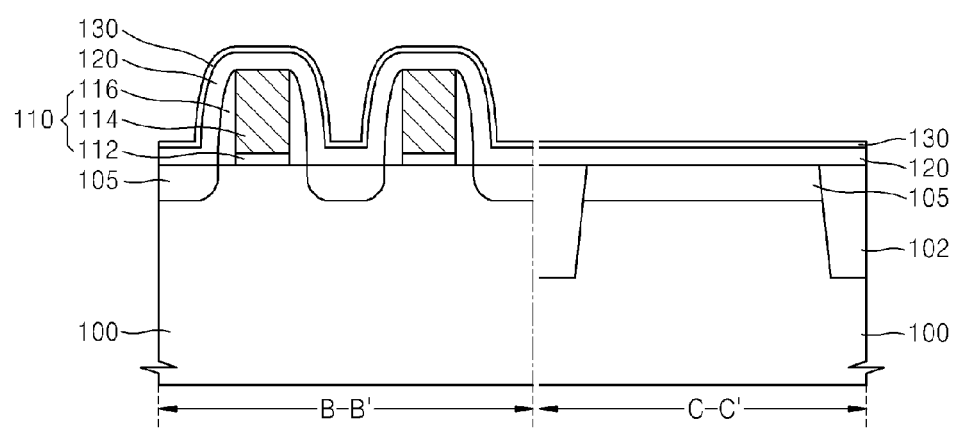

Referring to FIG. 2C, the second nitride layer 130 is formed directly on the first nitride layer 120 in this example. As mentioned above, the second nitride layer 130 may be a nitride having a lower atomic % of silicon than the first nitride layer 120. Also, the second nitride layer 130 may have an atomic ratio of silicon to nitrogen that is smaller than that of the first nitride layer 120.

The second nitride layer 130 may be formed using the same type of deposition method as the first nitride layer 120. Therefore, for example, the second nitride layer 130 may be deposited using $SiH_4$ gas and $NH_3$ gas as source gas. In this example, the ratio of the $SiH_4$ gas to $NH_3$ gas is controlled so that the second nitride layer 130 is formed as a nitride layer whose atomic ratio of silicon to nitrogen is equal to or greater than 0.9. In particular, less $SiH_4$ gas is used in the deposition process of forming the second nitride layer 130 than in the forming of the first nitride layer 120. Consequently, very little $SiH_4$ gas remains after the deposition processes, i.e., the amount of SiH$_4$ gas which is not completely purged may be reduced, so that the surface of the second nitride layer 130 is rather uniform.

Figure 1B:
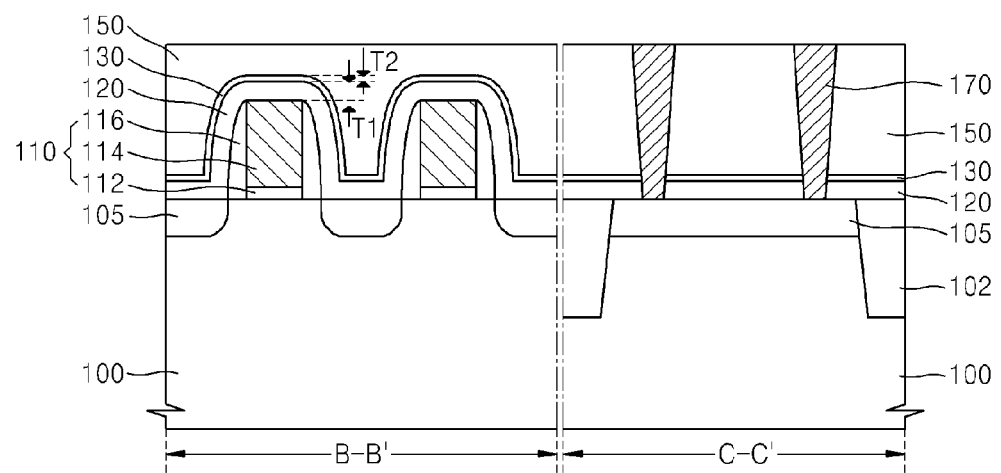
FIG. 1B illustrates a cross section B-B' and a cross section C-C' of the semiconductor device of FIG. 1A.

Furthermore, as a result of these processes, the first nitride layer 120 has a higher density than the second nitride layer 130 formed thereafter (see FIG. 1B). Accordingly, external materials such as ions are prevented from diffusing into the gate insulating layer 112. This will be described in more detail below with reference to FIG. 8.

Figure 2D:
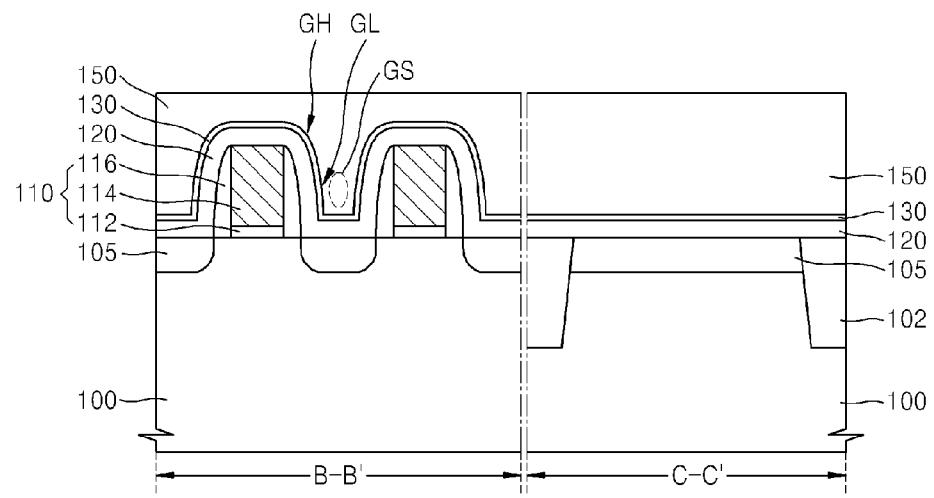

Referring to FIG. 2D, the interlayer insulating layer 150 is formed on the substrate 100 to a predetermined thickness. The interlayer insulating layer 150 may be a silicon oxide layer. The interlayer insulating layer 150 may be formed using a CVD method.

In this example of the present embodiment, the deposition rate at which the interlayer insulating layer 150 is formed is uniform up to the level of an upper portion GH of the second nitride layer 130 (i.e., the rate at which the interlayer insulating layer 150 is formed up to the top of a lower portion GL of the second nitride layer 130 is similar to the rate at which the interlayer insulating layer 150 is formed between the top of the lower portion GL and the top of the upper portion GH of the second nitride layer 130). This is because, as described above, the surface of the second nitride layer 130 is highly uniform.

More specifically, the deposition rate of the interlayer insulating layer 150 is dependent of the surface characteristics of the second nitride layer 130. If SiH$_4$ gas were to remain on the surface of the second nitride layer 130, the surface characteristics thereof would vary, and the deposition rate of the interlayer insulating layer 150 would vary in the direction along the surface of the second nitride layer 130, i.e., in essentially the vertical direction. If the deposition rate were greater at the upper portion GH of the second nitride than at the lower portion GL of the second nitride layer 130, an overhang of the insultating material could be produced on the upper portion GH of the second nitride layer 130. However, such an overhang is prevented in this embodiment of the inventive concept and accordingly, voids in a portion GS between adjacent gate structures 110 may be also be prevented.

Figure 2E:
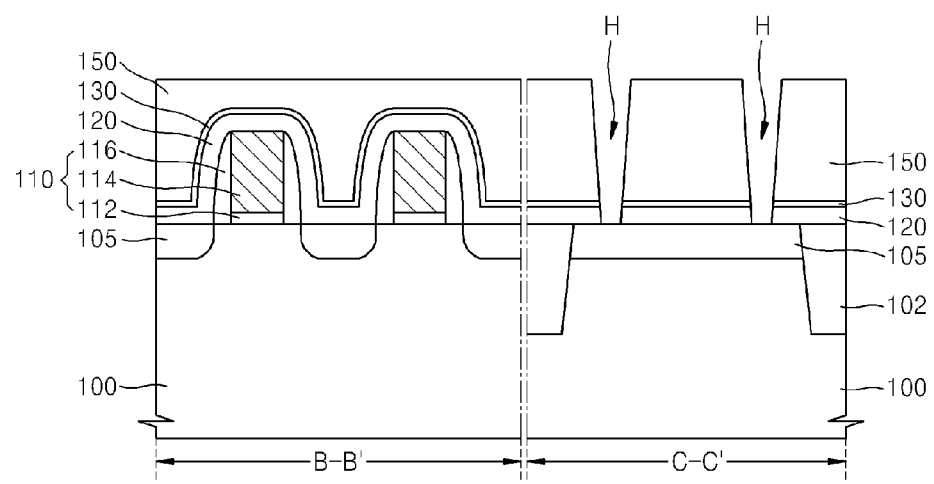

Referring to FIG. 2E, next, a portion of each of the first nitride layer 120, the second nitride layer 130, and the interlayer insulating layer 150 on the source/drain region 105 are etched to form a contact holes H. The etching may be anisotropic, and the second nitride layer 130 may be used as an etch stop layer in this process. In an example of this embodiment in which the first nitride layer 120 and the third nitride layer 130 are formed of a silicon nitride, and the interlayer insulating layer 150 is formed of a silicon oxide, the first nitride layer 120 and the third nitride layer 130 have a high etching selectivity with respect to the interlayer insulating layer 150. Accordingly, the above-described etching may be performed in two stages: a first stage of etching the interlayer insulating layer 150 using the first nitride layer 120 and the third nitride layer 130 as an etch stop layer, and a subsequent stage of etching the first nitride layer 120 and the third nitride layer 130.

Next, referring to FIG. 1B also, the contact holes H are filled with conductive material in to form the contact plug layer 170 (constituting the contact plugs MC). The conductive material may include tungsten (W).

If voids were to be formed between the gates GATE in the operation described with reference to FIG. 2D, the voids could open to a contact hole H in which case the conductive material would be deposited in the voids through the contact hole H. In this case, an electrical short circuit could occur between the contact plugs MC which are adjacent to one another in, for example, the y-direction of FIG. 1A. However, such voids are prevented from being produced according to this method of the inventive concept and thus, the semiconductor device 1000 is highly reliable.

Other embodiments of a semiconductor device according to the inventive concept will now be described with reference to FIGS. 3-6.

Figure 3:
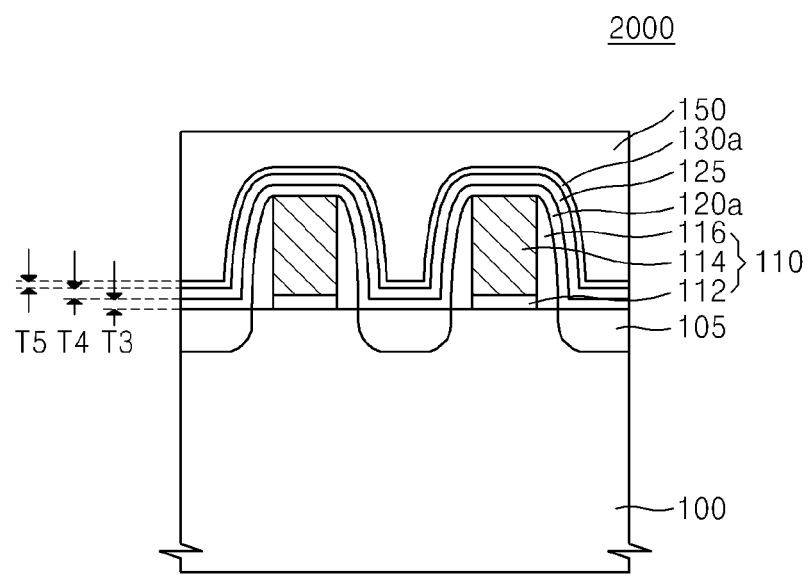
FIG. 3 is a cross-sectional view of another embodiment of a semiconductor device according to the inventive concept.

In the embodiment of FIG. 3, the semiconductor device 2000 includes a substrate 100, a gate structure 110, a first nitride layer 120a, an intermediate nitride layer 125, and a second nitride layer 130a. The gate structure 110 may include a gate insulating layer 112, a gate electrode layer 114, and a spacer 116.

The intermediate nitride layer 125 is interposed between the first nitride layer 120a and the second nitride layer 130a. The first nitride layer 120a and the second nitride layer 130a may be silicon nitride layers. For example, the first nitride layer 120a may be a silicon-rich nitride layer, and the second nitride layer 130a may be a nitride layer having a atomic % of silicon less than that of the first nitride layer 120a.

The atomic ratio of silicon to nitrogen of the intermediate nitride layer 125 may be smaller than that of the first nitride layer 120a and higher than that of the second nitride layer 130a. For example, the intermediate nitride layer 125 may have an atomic ratio of silicon to nitrogen that exceeds 0.9 and is less than 1.0. In an example of this embodiment, the first nitride layer 120a is a silicon-rich nitride layer, the second nitride layer 130a is a nitrogen-rich nitride layer, and the intermediate layer 125 is a stoichiometric nitride layer.

Also, in an example of this embodiment, the first nitride layer 120a has a thickness T3, the intermediate nitride layer 125 has a thickness T4, and the second nitride layer 130a has a thickness T5.

The first nitride layer 120, the intermediate nitride layer 125 and the second nitride layer 130 may be formed in-situ. In particular, the intermediate nitride layer 125 may be formed after the first nitride layer 120a and before the second nitride layer 130a in a continuous process in which the ratio of gases making up the source gas is varied.

Figure 4:
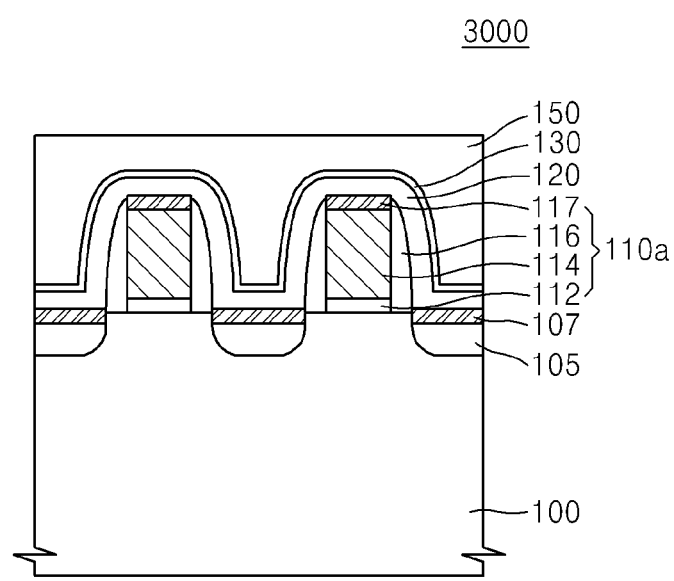
FIG. 4 is a cross-sectional view of another embodiment of a semiconductor device according to the inventive concept.

In the embodiment shown in FIG. 4, the semiconductor device 3000 includes a substrate 100, a gate structure 110a, a first nitride layer 120, and a second nitride layer 130. A source/drain region 105 is disposed on the opposite sides of the gates constituted by a gate structure 110a, and a silicide layer 107.

The gate structure 110a may include a gate insulating layer 112, a gate electrode layer 114, a spacer 116, and a gate silicide layer 117. Although the silicide layer 117 may be formed simultaneously on the gate electrode layer 114 and on the source/drain region 105, the portions of the silicide layer 117 will be referred to respectively in the present specification as source/drain silicide layer 107 and gate silicide layer 117. The gate electrode layer 114 may include polysilicon.

The source/drain silicide layer 107 and the gate silicide layer 117 may include at least one metal selected from the group consisting of cobalt (Co), nickel (Ni), platinum (Pt), and tantalum (Ta), and a silicon compound.

The source/drain silicide layer 107 and a gate silicide layer 117 are formed after forming the gate structure 110 and the source/drain region 105 described above with reference to FIG. 2A. First, a metal layer (not shown) is formed on the gate structure 110 and the source/drain region 105. The metal layer may include one of titanium (Ti), cobalt (Co), platinum (Pt), and nickel (Ni). Next, a thermal process is performed such that the gate electrode layer 114 and the source/drain region 105 and the metal layer react to form the source/drain silicide layer 107 and the gate silicide layer 117.

The source/drain silicide layer 107 and the gate silicide layer 117, which are formed without a photolithography process, have a self-aligned structure and thus may be referred as self-aligned silicide. The source/drain silicide layer 107 and the gate silicide layer 117 respectively reduce a resistance of the source/drain region 105 and the gate electrode layer 114.

Figure 5:
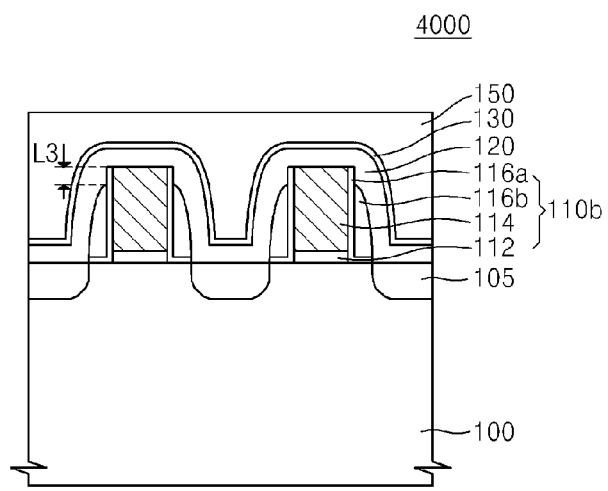
FIG. 5 is a cross-sectional view of another embodiment a semiconductor device according to of the inventive concept.

In the embodiment of FIG. 5, the semiconductor device 4000 includes a substrate 100, a gate structure 110b, a first nitride layer 120, and a second nitride layer 130. The gate structure 110b includes a gate insulating layer 112, a gate electrode layer 114, a first spacer 116a, and a second spacer 116b.

The first spacer 116a may be a silicon nitride layer or a silicon oxide layer, or may be a plurality of layers each including a silicon nitride or silicon oxide. Although not illustrated in detail in FIG. 5, for example, the first spacer 116a may include a silicon nitride layer and a silicon oxide layer that are disposed sequentially from a sidewall of the gate electrode layer 114 and in this case, the silicon oxide layer may extend over an upper surface of the gate electrode layer 114 and the substrate 100.

The second spacer 116b may include a silicon nitride. The second spacer 116b may terminate at a level below that of an upper surface of the gate electrode layer 114 such that the top of second spacer 116b and the upper surface of the gate electrode layer 114 are spaced by a (vertical) distance L3. Electrical characteristics and reliability of the semiconductor device 4000 are improved by the first spacer 116a and the second spacer 116b.

Figure 6:
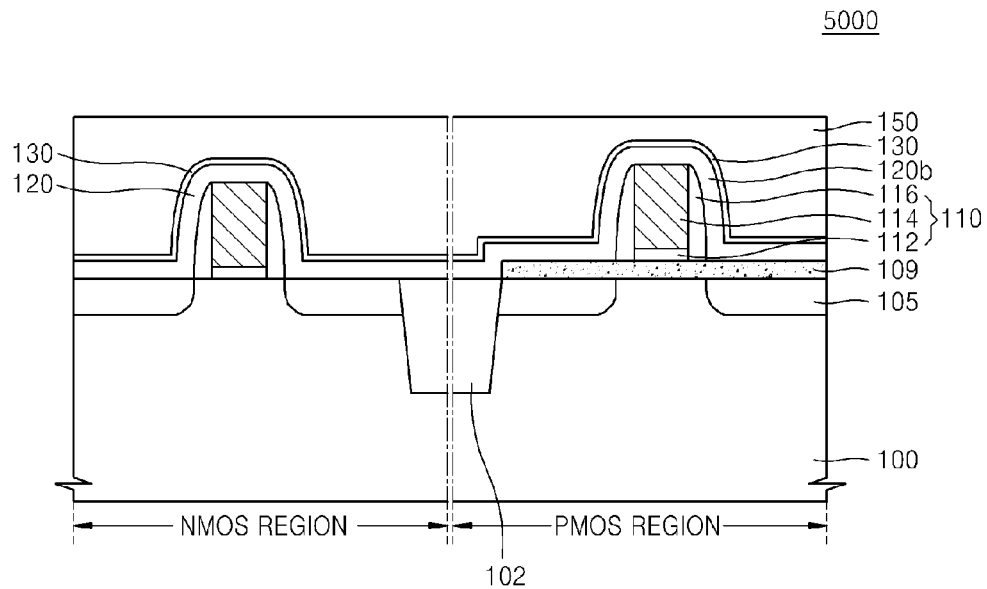
FIG. 6 is a cross-sectional view of another embodiment of a semiconductor device according to the inventive concept.

In the embodiment of FIG. 6, the semiconductor device 5000 has an NMOS region in which an n-channel transistor is formed and a PMOS region in which a p-channel transistor is formed. Also, the semiconductor device 5000 includes gate structures 110 disposed in the NMOS region and the PMOS region of the substrate 100, first nitride layers 120 and 120b, and second nitride layers 130.

In the PMOS region, a semiconductor layer 109 is interposed between the substrate 100 and the gate structure 110. The semiconductor layer 109 may include a Group III-V semiconductor compound or a Group II-VI semiconductor oxide. In an example of this embodiment, the semiconductor layer 109 is an epitaxial layer of silicon germanium (SiGe). In this case, SiGe has a band gap energy smaller than that of silicon, and thus, a threshold voltage of the semiconductor device 5000 may be efficiently controlled by means of the provision of the semiconductor layer 109. In addition, SiGe has a relatively fast charge mobility, and thus, the semiconductor device 5000 has excellent current characteristics.

Also, the first nitride layers 120 and 120b may be formed to apply different types of stress to the NMOS region and the PMOS region. For example, the first nitride layer 120 in the NMOS region may be formed to apply a tensile stress, and the first nitride layer 120b in the PMOS region may be formed to apply a compressive stress. The second nitride layers 130 may also be formed to apply different types of stress to the NMOS region and the PMOS region.

Figure 7:
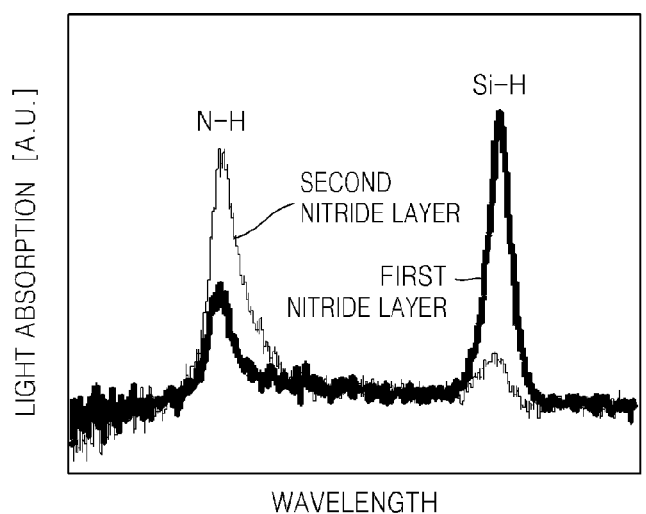
FIG. 7 is a graph showing light absorption of nitride layers of an embodiment of a semiconductor device according to the inventive concept.

FIG. 7 is a graph showing light absorption of nitride layers of a semiconductor device according to the inventive concept.

More specifically, FIG. 7 illustrates light absorption of the first nitride layer 120 and the second nitride layer 130 of the semiconductor device 1000 (FIG. 1B). Light absorption was measured using Fourier Transform infrared spectroscopy.

In the first nitride layer 120, a proportion of Si—H bonds is higher than that of N—H bonds. In the second nitride layer 130, a proportion of N—H bonds is higher than that of Si—H bonds. Nitrogen and silicon of the first and second nitride layers 120 and 130 are bonded to hydrogen in the first and second nitride layers 120 and 130, and thus N—H bonds and Si—H bonds may be analyzed. When comparing the first and second nitride layers 120 and 130, the second nitride layer 130 has more N—H and fewer Si—H bonds compared to the first nitride layer 120.

The first nitride layer 120 and the second nitride layer 130 were also analyzed using X-ray photoelectron spectroscopy (XPS). This analysis showed that the atomic ratio of silicon to nitrogen in the first nitride layer 120 was 1.06, and in the second nitride layer 130 was 0.87. However, the inventive concept is not limited to a semiconductor device having these atomic ratios.

Figure 8:
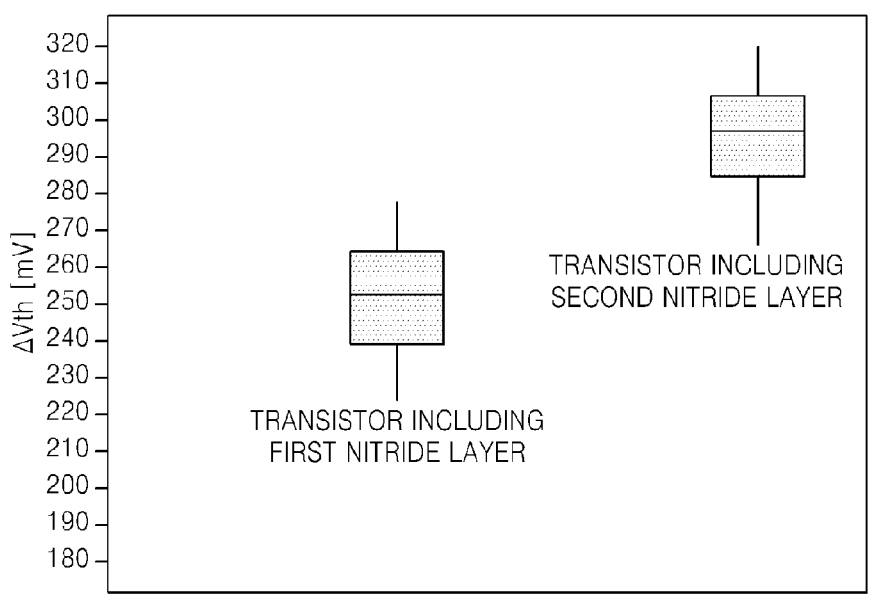
FIG. 8 is a graph showing electrical characteristics of transistors having only one each of nitride layers of a semiconductor device according to the inventive concept.

FIG. 8 is a graph showing electrical characteristics of a semiconductor device according to the inventive concept.

FIG. 8 shows a variation $\Delta V_{th}$ in threshold voltage for an NMOS transistor including only the first one of the nitride layers (nitride layer 120) and for an NMOS transistor including only the second one of the nitride layers (nitride layer 130) as each nitride layer was described in connection with the embodiment of FIGS. 1A-C.

Also, two NMOS transistors whose channel regions had the same lengths but widths of 1 μm and 0.03 μm (threshold voltage for 0.03 μm—threshold voltage for 1 μm), respectively, were used in each case to obtain the variation $\Delta V_{th}$ in threshold voltage. The length of the channel regions refer to the dimension in the x-direction of that part of the active region ACT that crosses the gate GATE in FIG. 1A. The width of the channel regions refers to the dimension in the y-direction in FIG. 1A of that part of the active region ACT that crosses the gate GATE.

As shown in FIG. 8, the threshold voltage increased when the width of the channel region decreased in both the transistor including the first nitride layer 120 and the transistor including the second nitride layer 130. However, the difference in threshold voltage between the transistors including the first nitride layer 120 was about 254 mV, and the difference in threshold voltage between the transistors including the second nitride layer 130 was about 298 mV. Accordingly, in the transistor including the first nitride layer 120, an increase in the threshold voltage having a narrow width may be mitigated compared to the transistor including the second nitride layer 130.

The above phenomenon may be explained partly by a flow of impurities into the gate insulating layer. The first nitride layer 120 is a high density film compared to the second nitride layer 130. Accordingly, the first nitride layer 120 may prevent impurities such as oxygen ions from penetrating into the gate insulating layer from the outside.

Accordingly, in a semiconductor device according to the inventive concept, a narrow width effect may be reduced by the presence of the first nitride layer 120. The narrow width effect refers to an increase or a decrease in threshold voltage as the width of the channel region of semiconductor devices is reduced, which affects a reliability of the semiconductor device.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device comprising:
a substrate;
a gate structure that is disposed on the substrate and includes a gate insulating layer and a gate electrode layer;
a first nitride layer that is disposed on the substrate and the gate structure and includes silicon; and
a second nitride layer that is disposed on the first nitride layer and has a lower atomic percentage of silicon than the first nitride layer.

2. The semiconductor device of claim 1, wherein the ratio of silicon atoms to nitrogen atoms in the second nitride layer is smaller than that in the first nitride layer.

3. The semiconductor device of claim 1, wherein the ratio of silicon atoms to nitrogen atoms in the second nitride layer is less than or equal to 0.9.

4. The semiconductor device of claim 1, wherein the first nitride layer is a silicon-rich nitride layer.

5. The semiconductor device of claim 1, wherein the ratio of silicon atoms to nitrogen atoms in the first nitride layer is greater than or equal to 1.0.

6. The semiconductor device of claim 1, wherein the first nitride layer has a greater thickness than the second nitride layer.

7. The semiconductor device of claim 1, wherein the thickness of the first nitride layer is in a range of from 150 Å to 300 Å, and the thickness of the second nitride layer is in a range of from 10 Å to 100 Å.

8. The semiconductor device of claim 1, wherein the substrate has a channel region below the gate structure, and at least one of the first nitride layer and the second nitride layer applies stress to the channel region.

9. The semiconductor device of claim 8, wherein the first nitride layer and the second nitride layer apply the same type of stress, either tensile stress or compressive stress, to the channel region.

10. The semiconductor device of claim 1, wherein the gate insulating layer comprises a high-k dielectric material, and the gate electrode comprises a metal.

11. The semiconductor device of claim 1, wherein the substrate has a source region/drain region beside the gate structure, and further comprising:
an interlayer insulating layer on the second nitride layer; and
a plurality of contact plugs connected to the source/drain region, and
wherein at least one of the first nitride layer and the second nitride layer comprises a material that has an etch selectivity with respect to the interlayer insulating layer.

12. The semiconductor device of claim 1, wherein the gate structure comprises a plurality of gates spaced apart at predetermined intervals in a first direction, and
the first nitride layer and the second nitride layer have curved portions between each pair of the gates adjacent one another in the first direction.

13. The semiconductor device of claim 12,
wherein the substrate has a plurality of source regions disposed to one side of each of the gates and spaced apart from one another in a second direction different from the first direction, and a plurality of drain regions disposed to other side of the plurality of gates and spaced from one another in the second direction; and
further comprising a plurality of contact plugs that are electrically connected to each of the source regions, and a plurality of contact plugs that are electrically connected to each the plurality of drain regions.

14. The semiconductor device of claim 1, wherein the gate structure further comprises a metal silicide layer disposed at an upper end of the gate electrode layer.

15. A semiconductor device comprising:
a substrate having a plurality of active regions that are spaced apart from one another in a first direction;
a plurality of gates on the substrate and each of which crosses the plurality of active regions, the gates spaced apart from one another in a second direction different from the first direction;
a first nitride layer disposed on the gates and extend over an upper surface of the substrate to the side of the gates;
a second nitride layer that is disposed on the first nitride layer and has an atomic percentage of silicon different from that of the first nitride layer; and
a plurality of contact plugs that are interposed between the gates in the first direction, and extend through the first nitride layer and the second nitride layer over the active regions.

16. A semiconductor device comprising:
a substrate having an active region;
a plurality of gates spaced apart from one another in a first direction so that each pair of gates adjacent one another in the first direction has opposing sidewall surfaces, each of the gates extending across the active region in a second direction different from the first direction;
a first nitride layer that includes silicon and covers the opposing sidewall surfaces of each pair of the gates adjacent one another in the first direction;
a second nitride layer that includes silicon, covers the first nitride layer on said opposing sidewall surfaces of each pair of the gates adjacent one another in the first direction, and has an atomic percentage of silicon different from that of the first nitride layer;
an interlayer insulating layer disposed on the substrate and occupying a region of the device between the gates; and
at least one respective contact plug extending through the interlayer insulating layer at a location between the gates in the first direction.

17. The semiconductor device of claim 16, wherein the first and second nitride layers extend over the active region between the gates, and the at least one respective contact plug extends through the first nitride layer and the second nitride layer.

18. The semiconductor device of claim 16, wherein the ratio of silicon atoms to nitrogen atoms in the second nitride layer is smaller than that in the first nitride layer.

19. The semiconductor device of claim 16, wherein the first nitride layer is a silicon-rich nitride layer.

20. The semiconductor device of claim 16, wherein the first nitride layer has a greater thickness than the second nitride layer.

* * * * *